(12) United States Patent
Nagaiwa

(10) Patent No.: US 11,264,208 B2
(45) Date of Patent: Mar. 1, 2022

(54) PLASMA PROCESSING APPARATUS AND METHOD FOR CONTROLLING RADIO-FREQUENCY POWER SUPPLY OF PLASMA PROCESSING APPARATUS

(71) Applicant: TOKYO ELECTRON LIMITED, Tokyo (JP)

(72) Inventor: Toshifumi Nagaiwa, Hsin-chu (TW)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/645,695

(22) PCT Filed: Jun. 3, 2019

(86) PCT No.: PCT/JP2019/022024
§ 371 (c)(1),
(2) Date: Mar. 9, 2020

(87) PCT Pub. No.: WO2019/239944
PCT Pub. Date: Dec. 19, 2019

(65) Prior Publication Data
US 2020/0266035 A1    Aug. 20, 2020

(30) Foreign Application Priority Data

Jun. 12, 2018    (JP) .............................. JP2018-111973

(51) Int. Cl.
*H01J 37/32*    (2006.01)
*H05H 1/46*    (2006.01)

(52) U.S. Cl.
CPC .. *H01J 37/32091* (2013.01); *H01J 37/32532* (2013.01); *H01J 37/32642* (2013.01);
(Continued)

(58) Field of Classification Search
CPC .......... H01J 2237/334; H01J 37/32091; H01J 37/32532; H01J 37/32642; H01J 37/32743; H01L 21/3065; H01L 21/683; H05H 1/46
(Continued)

(56) References Cited

U.S. PATENT DOCUMENTS

| | | | |
|---|---|---|---|
| 2014/0034243 A1* | 2/2014 | Dhindsa | H01J 37/21 156/345.51 |
| 2015/0170925 A1* | 6/2015 | Chen | H01J 37/32642 438/758 |
| 2018/0366305 A1* | 12/2018 | Nagami | H01J 37/32642 |

FOREIGN PATENT DOCUMENTS

| | | |
|---|---|---|
| JP | 2003-124201 A | 4/2003 |
| JP | 2014-186994 A | 10/2014 |

OTHER PUBLICATIONS

International Search Report issued for PCT Application No. PCT/JP2019/022024 dated Jul. 16, 2019, 5 pages.

* cited by examiner

*Primary Examiner* — Lan Vinh
(74) *Attorney, Agent, or Firm* — Weihrouch IP

(57) ABSTRACT

A plasma processing apparatus includes a chamber, a substrate support, a radio-frequency power supply, and a controller. The substrate support includes a lower electrode and is disposed in the chamber to mount a focus ring to surround a disposed substrate on the substrate support. The radio-frequency power supply supplies a bias radio-frequency power to the lower electrode. The controller causes specifying a power level of the bias radio-frequency power corresponding to a specified value of the DC potential of the focus ring by using a table or a function that defines a relationship between the power level of the bias radio-frequency power and the DC potential of the focus ring (Continued)

generated by supplying the bias radio-frequency power to the lower electrode, and controlling the radio-frequency power supply to supply the bias radio-frequency power having the specified power level to the lower electrode during a plasma generation in the chamber.

9 Claims, 7 Drawing Sheets

(52) U.S. Cl.
CPC ......... *H01J 37/32743* (2013.01); *H05H 1/46* (2013.01); *H01J 2237/334* (2013.01)

(58) Field of Classification Search
USPC ............ 216/67; 156/345.29, 345.41, 345.48, 156/345.14; 438/714
See application file for complete search history.

PLASMA PROCESSING APPARATUS AND METHOD FOR CONTROLLING RADIO-FREQUENCY POWER SUPPLY OF PLASMA PROCESSING APPARATUS

CROSS REFERENCE TO RELATED APPLICATION

This application is a 35 U.S.C. 371 National Phase Entry Application from PCT/JP2019/022024, filed Jun. 3, 2019, which claims priority to Japanese Patent Application No. 2018-111973, filed Jun. 12, 2018, the disclosures of which are incorporated herein in their entirety by reference, and priority is claimed to each of the foregoing.

TECHNICAL FIELD

The present disclosure relates to a plasma processing apparatus and a method for controlling a radio-frequency power supply of the plasma processing apparatus.

BACKGROUND

In manufacturing electronic devices, plasma etching is performed on a substrate. The plasma etching is performed by a plasma processing apparatus. The plasma processing apparatus includes a chamber, a support, and a radio-frequency power supply. The support includes a lower electrode and is disposed in the chamber. The radio-frequency power supply is configured to supply a bias radio-frequency power to the lower electrode. The plasma processing apparatus described above is disclosed in, e.g., Patent Documents 1 and 2.

In plasma etching, the energy of ions attracted from plasma to the substrate is adjusted by a power level of the bias radio-frequency power. Therefore, an etching rate is adjusted by the power level of the bias radio-frequency power.

PRIOR ART

Patent Document 1: Japanese Patent Application Publication No. 2014-186994
Patent Document 2: Japanese Patent Application Publication No. 2003-124201

In plasma etching, it is required to improve the controllability of the etching rate.

SUMMARY

In accordance with one exemplary embodiment of the present disclosure, there is provided a plasma processing apparatus. The plasma processing apparatus includes a chamber, a substrate support, a radio-frequency power supply, and a controller. The substrate support is disposed in the chamber and includes a lower electrode. The radio-frequency power supply is configured to supply a bias radio-frequency power to the lower electrode. The controller is configured to control the radio-frequency power supply. A focus ring is mounted on the substrate support to surround the substrate. The controller is configured to specify a power level of the bias radio-frequency power corresponding to a specified value of a DC potential of the focus ring by using a table or a function that defines a relationship between the power level of the bias radio-frequency power and the DC potential of the focus ring generated by supplying the bias radio-frequency power to the lower electrode. The controller is further configured to control the radio-frequency power supply to supply the bias radio-frequency power having the specified power level to the lower electrode during a plasma generation in the chamber.

Effect of the Invention

The plasma processing apparatus according to one exemplary embodiment can improve the controllability of the etching rate.

DETAILED DESCRIPTION

Figure 1:
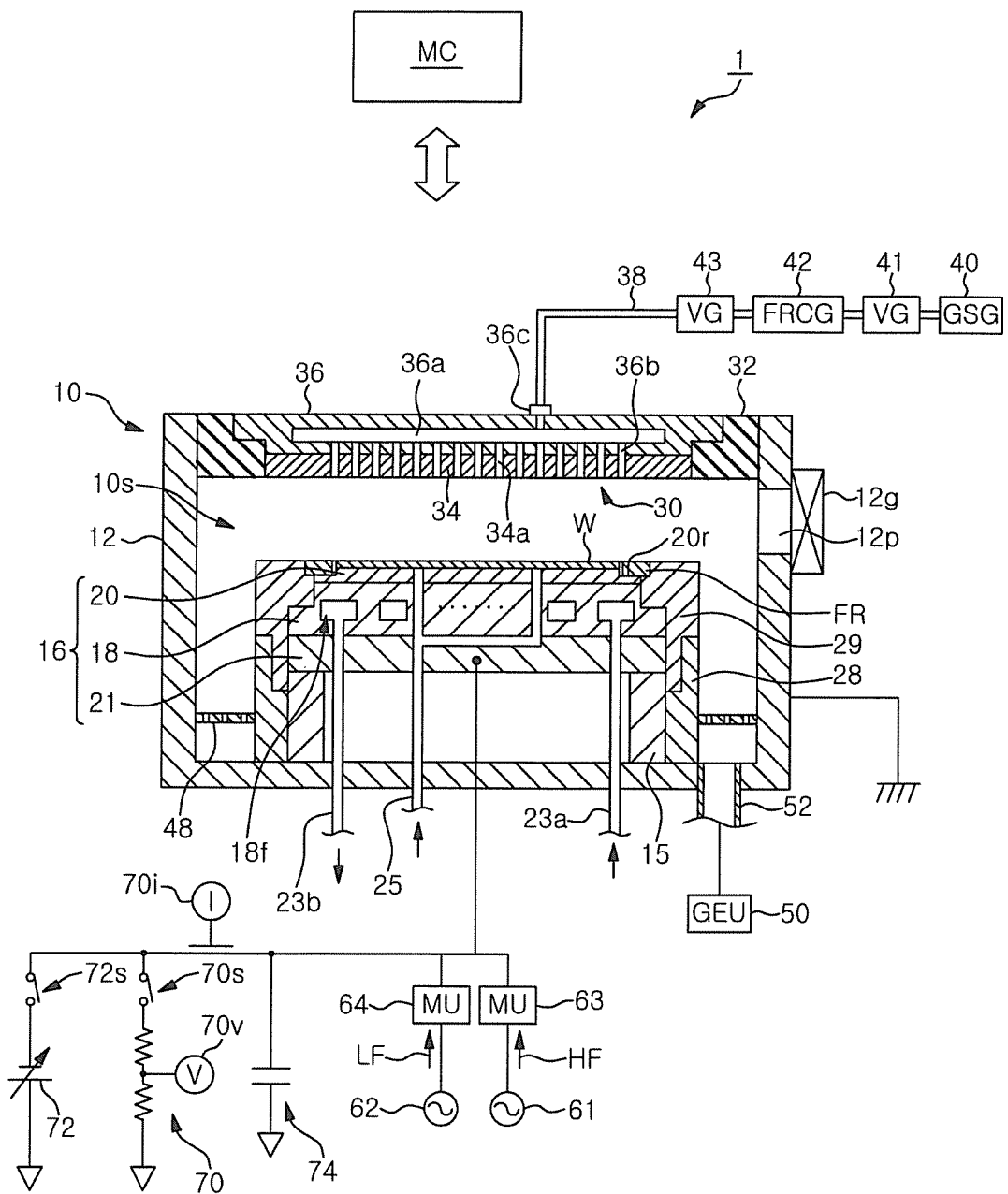
FIG. 1 schematically shows a plasma processing apparatus according to one exemplary embodiment.

Hereinafter, various exemplary embodiments will be described.

In one exemplary embodiment, a plasma processing apparatus is provided. The plasma processing apparatus includes a chamber, a substrate support, a radio-frequency power supply, and a controller. The substrate support is disposed in the chamber and includes a lower electrode. The radio-frequency power supply is configured to supply a bias radio-frequency power to the lower electrode. The controller is configured to control the radio-frequency power supply. A focus ring is mounted on the substrate support to surround the substrate. The controller is configured to specify a power level of the bias radio-frequency power corresponding to a specified value of a DC potential of the focus ring by using a table or a function that defines a relationship between the power level of the bias radio-frequency power and the DC potential of the focus ring generated by supplying the bias radio-frequency power to the lower electrode. The controller is further configured to control the radio-frequency power supply to supply the bias radio-frequency power having the specified power level to the lower electrode during a plasma generation in the chamber.

The etching rate is increased as the power level of the bias radio-frequency power is increased. The power level of the bias radio-frequency power has a non-linear relationship with the etching rate. On the other hand, the DC potential of the focus ring generated by supplying the bias radio-frequency power during the plasma generation is substantially the same as the DC potential of the substrate and is substantially linearly proportional to the etching rate. In the plasma processing apparatus according to one exemplary embodiment, the power level of the bias radio-frequency power is determined based on the DC potential of the focus ring having a substantially linear relationship with the etching rate. Therefore, in accordance with the plasma processing apparatus, the controllability of the etching rate can be improved.

In one exemplary embodiment, the plasma processing apparatus may further include a measurement circuit. The measurement circuit is configured to obtain a measurement value indicating the DC potential of the focus ring. The controller adjusts the power level of the bias radio-frequency power during the plasma generation in the chamber to reduce a difference between the specified value and the DC potential of the focus ring determined by the measurement value. Even when the bias radio-frequency power of the same power level is applied to the lower electrode, the DC potential of the focus ring may be changed due to the changes of the state of the plasma processing apparatus, for example. In the embodiment, the power level of the bias radio-frequency power is adjusted to reduce the difference between the specified value and the actual DC potential of the focus ring FR obtained from the measurement value. Therefore, a desired etching rate is realized with high accuracy.

In one exemplary embodiment, the plasma processing apparatus may further include a DC power supply configured to be selectively connected to the focus ring. In accordance with the embodiment, a DC voltage can be applied to the focus ring. Further, when the measurement value is measured, the DC power supply can be electrically disconnected from the focus ring.

In one exemplary embodiment, the plasma processing apparatus may be a capacitively coupled plasma processing apparatus.

In one exemplary embodiment, a method for controlling a radio-frequency power supply of a plasma processing apparatus is provided. The method includes specifying a power level of a bias radio-frequency power corresponding to a specified value of a DC potential of a focus ring. The power level of the bias radio-frequency power is specified by using a table or a function that defines a relationship between the power level of the bias radio-frequency power and the DC potential of the focus ring generated by supplying the bias radio-frequency power to a lower electrode of a substrate support. The substrate support is disposed in a chamber of the plasma processing apparatus and the focus ring is mounted on the substrate support to surround the substrate. The method further includes controlling the radio-frequency power supply to supply the bias radio-frequency power having the specified power level to the lower electrode during plasma generation in the chamber.

In one exemplary embodiment, the method may further include adjusting the power level of the bias radio-frequency power supply during the plasma generation in the chamber. The power level of the bias radio-frequency power supply is adjusted to reduce a difference between the specified value and the DC potential of the focus ring determined by the measurement value.

Hereinafter, various exemplary embodiments will be described in detail with reference to the accompanying drawings. Like reference numerals will be given to like or corresponding parts throughout the drawings.

FIG. 1 schematically shows a plasma processing apparatus according to one exemplary embodiment. The plasma processing apparatus 1 shown in FIG. 1 is a capacitively coupled plasma processing apparatus. The plasma processing apparatus 1 includes a chamber 10. The chamber 10 has an inner space 10s. In one embodiment, the chamber 10 includes a chamber body 12. The chamber body 12 has a substantially cylindrical shape. The inner space 10s is provided in the chamber body 12. The chamber body 12 is made of, e.g., aluminum. The chamber body is electrically grounded. A plasma-resistant film is formed on an inner wall surface of the chamber body 12, i.e., a wall surface that defines the inner space 10s. The plasma-resistant film may be a film formed by anodic oxidation treatment or a ceramic film such as a film made of yttrium oxide.

A passage 12p is formed at a sidewall of the chamber body 12. A substrate W is transferred between the inner space 10s and the outside of the chamber 10 through the passage 12p. The passage 12p can be opened and closed by a gate valve 12g disposed along the sidewall of the chamber body 12.

A substrate support, i.e., a support 16, is disposed in the inner space 10s. The support 16 is disposed in the chamber 10. The support 16 is configured to support the substrate W mounted thereon. The support 16 is supported by a supporting part 15. The supporting part 15 extends upward from the bottom portion of the chamber body 12. The supporting part 15 has a substantially cylindrical shape and is made of an insulating material such as quartz.

The support 16 may include a lower electrode 18 and an electrostatic chuck 20. The support 16 may further include an electrode plate 21. The electrode plate 21 is made of a conductive material such as aluminum and has a substantially disc shape. The lower electrode 18 is disposed on the electrode plate 21. The lower electrode 18 is made of a conductive material such as aluminum and has a substantially disc shape. The lower electrode 18 is electrically connected to the electrode plate 21.

A flow path 18f is formed in the lower electrode 18. The flow path 18f is a channel for a heat exchange medium. As an example of the heat exchange medium, a liquid coolant or a coolant (e.g., Freon) for cooling the lower electrode 18 by vaporization thereof is used. A circulation device (e.g., a chiller unit) for the heat exchange medium is connected to the flow path 18f. The circulation device is disposed outside the chamber 10. The heat exchange medium is supplied from the circulation device to the flow path 18f through a line 23a. The heat exchange medium supplied to the flow path 18f is returned to the circulation device through a line 23b.

The electrostatic chuck 20 is disposed on the lower electrode 18. When the substrate W is processed in the inner space 10s, the substrate W is mounted on and held by the electrostatic chuck 20. The electrostatic chuck 20 includes a main body and an electrode. The main body of the electrostatic chuck 20 is made of a dielectric material and has a substantially disc shape. The electrode of the electrostatic chuck 20 is a film-shaped electrode and is disposed in the main body of the electrostatic chuck 20. A DC power supply is electrically connected to the electrodes of the electrostatic chuck 20. When a voltage is applied from the DC power supply to the electrode of the electrostatic chuck 20, an electrostatic attractive force is generated between the electrostatic chuck 20 and the substrate W. Due to the electrostatic attractive force thus generated, the substrate W is attracted to and held on the electrostatic chuck 20.

The plasma processing apparatus 1 further includes a gas supply line 25. A heat transfer gas, e.g., He gas, is supplied through the gas supply line 25 from a gas supply mechanism to a gap between an upper surface of the electrostatic chuck 20 and a backside (bottom surface) of the substrate W.

The plasma processing apparatus 1 further includes a cylindrical member 28 and an insulating member 29. The cylindrical member 28 extends upward from the bottom portion of the chamber body 12. The cylindrical member 28 extends along an outer periphery of the supporting part 15. The cylindrical member 28 is made of a conductive material and has a substantially cylindrical shape. The cylindrical member 28 is electrically grounded. The insulating member 29 is disposed on the cylindrical member 28. The insulating member 29 is made of an insulating material. The insulating member 29 is made of ceramic such as quartz. The insulating member 29 has a substantially cylindrical shape. The insulating member 29 extends along an outer periphery of the electrode plate 21, an outer periphery of the lower electrode 18, and an outer periphery of the electrostatic chuck 20.

Figure 2:
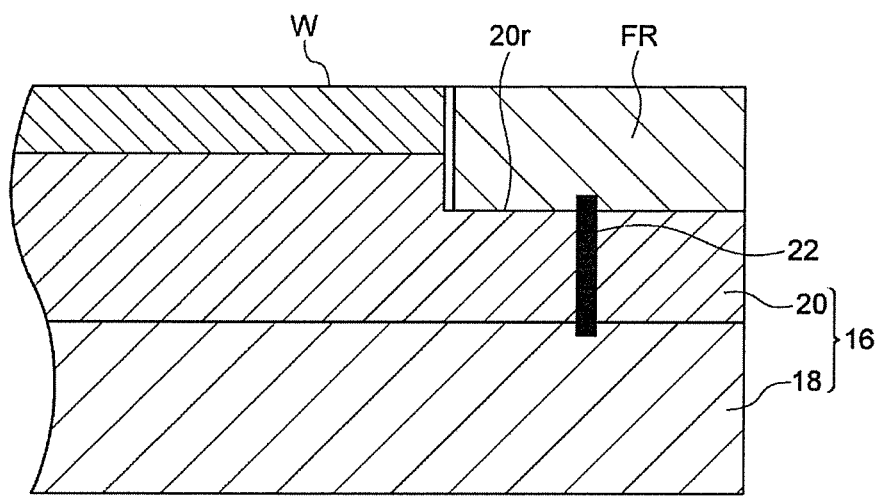
FIG. 2 is a partially enlarged cross-sectional view of a support and a focus ring of the plasma processing apparatus according to one exemplary embodiment.

Hereinafter, FIG. 2 will be referred to together with FIG. 1. FIG. 2 is a partially enlarged cross-sectional view of the support and a focus ring of the plasma processing apparatus according to one exemplary embodiment. The support 16 has a mounting region 20r. The focus ring FR is mounted on the mounting region 20r. In one example, the mounting region 20r is an outer peripheral region of the electrostatic chuck 20. The focus ring FR has a substantially annular plate shape. The focus ring FR has conductivity. The focus ring FR is made of, e.g., silicon or silicon carbide (SiC). The substrate W has a disc shape and is disposed in a region surrounded by the focus ring FR on the electrostatic chuck 20. In other words, the focus ring FR surrounds the edge of the substrate W mounted on the support 16.

As shown in FIG. 1, the plasma processing apparatus 1 further includes an upper electrode 30. The upper electrode 30 is disposed above the support 16. The upper electrode 30 closes an upper opening of the chamber body 12 in cooperation with a member 32. The member 32 has an insulating property. The upper electrode 30 is held at an upper portion of the chamber body 12 through the member 32.

The upper electrode 30 includes a ceiling plate 34 and a holder 36. A bottom surface of the ceiling plate 34 defines an inner space 10s. The ceiling plate 34 is provided with a plurality of gas injection holes 34a. The gas injection holes 34a penetrate through the ceiling plate 34 in a plate thickness direction (vertical direction). The ceiling plate 34 is made of, e.g., silicon, but is not limited thereto. Alternatively, the ceiling plate 34 may have a structure in which a plasma-resistant film is formed on a surface of an aluminum base material. The plasma-resistant film may be a film formed by anodic oxidation treatment or a ceramic film such as a film made of yttrium oxide.

The holder 36 detachably holds the ceiling plate 34. The holder 36 is made of a conductive material such as aluminum. A gas diffusion space 36a is formed in the holder 36. A plurality of gas holes 36b extends downward from the gas diffusion space 36a. The gas holes 36b communicate with the gas injection holes 34a, respectively. A gas inlet port 36c is formed at the holder 36. The gas inlet port 36c is connected to the gas diffusion space 36a. A gas supply line 38 is connected to the gas inlet port 36c.

The gas supply line 38 is connected to a gas source group (GSG) 40 through a valve group (VG) 41, a flow rate controller group (FRCG) 42, and a valve group (VG) 43. The gas source group 40, the valve group 41, the flow rate controller group 42, and the valve group 43 constitute a gas supply unit. The gas source group 40 includes a plurality of gas sources. Each of the valve group 41 and the valve group 43 includes a plurality of valves (e.g., on-off valves). The flow rate controller group 42 includes a plurality of flow rate controllers. Each of the flow rate controllers of the flow controller group 42 is a mass flow controller or a pressure control type flow rate controller. The gas sources of the gas source group 40 are connected to the gas supply line 38 through the corresponding valves of the valve group 41, the corresponding flow rate controllers of the flow controller group 42, and the corresponding valves of the valve group 43. The plasma processing apparatus 1 can supply gases from one or more gas sources selected among the plurality of gas sources of the gas source group 40 to the inner space 10s at individually controlled flow rates.

A baffle plate 48 is disposed between the cylindrical member 28 and the sidewall of the chamber body 12. The baffle plate 48 may be formed by coating ceramic such as yttrium oxide on an aluminum base material, for example. A plurality of through-holes is formed in the baffle plate 48. Below the baffle plate 48, a gas exhaust line 52 is connected to the bottom portion of the chamber body 12. A gas exhaust unit (GEU) 50 is connected to the gas exhaust line 52. The gas exhaust unit 50 includes a pressure controller such as an automatic pressure control valve and a vacuum pump such as a turbo molecular pump. The gas exhaust unit 50 is configured to reduce a pressure in the inner space 10s.

In one embodiment, the plasma processing apparatus 1 further includes a radio-frequency power supply 61. The radio-frequency power supply 61 generates a radio-frequency power HF for plasma generation. The radio-frequency power HF has a frequency within a range of 27 MHz to 100 MHz, e.g., 40 MHz or 60 MHz. The radio-frequency power supply 61 is connected to the lower electrode 18 through a matching unit (MU) 63 and the electrode plate 21 to supply the radio-frequency power HF to the lower electrode 18. The matching unit 63 has a matching circuit for matching an output impedance of the radio-frequency power supply 61 and an impedance of a load side (the lower electrode 18 side). The radio-frequency power supply 61 may not be electrically connected to the lower electrode 18, and may be connected to the upper electrode 30 through the matching unit 63.

The plasma processing apparatus 1 further includes a radio-frequency power supply 62. The radio-frequency power supply 62 generates a bias radio-frequency power, i.e., a radio-frequency power LF, for attracting ions to the substrate W. The frequency of the radio-frequency power LF is lower than the frequency of the radio-frequency power HF. The frequency of the radio-frequency power LF is within a range of 400 kHz to 13.56 MHz, e.g., 400 kHz. The radio-frequency power supply 62 is connected to the lower electrode 18 through a matching unit (MU) 64 and the electrode plate 21 to supply the radio-frequency power LF to the lower electrode 18. The matching unit 64 has a matching circuit for matching an output impedance of the radio-frequency power supply 62 and the impedance of the load side (the lower electrode 18 side).

In the plasma processing apparatus 1, a gas is supplied to the inner space 10s. Then, one or both of the radio-frequency power HF and the radio-frequency power LF are supplied to excite the gas in the inner space 10s. Accordingly, plasma is generated in the inner space 10s. The substrate W is processed by chemical species such as ions and/or radicals from the generated plasma.

In one embodiment, the plasma processing apparatus 1 further includes a measurement circuit 70. The measurement circuit 70 has a voltage sensor 70v. The measurement circuit 70 is electrically connected to the lower electrode 18 through a power supply line of the radio-frequency power LF and the electrode plate 21. As shown in FIG. 2, the lower electrode 18 is electrically connected to the focus ring FR through a conductor 22. Alternatively, the measurement circuit 70 may be electrically connected to the focus ring FR without passing through at least one of the power supply line of the radio-frequency power LF, the electrode plate 21, and the lower electrode 18. For example, the measurement circuit 70 may be connected to the focus ring FR through a different electrical path.

The measurement circuit 70 includes the voltage sensor 70v. The measurement circuit 70 may further include a current sensor 70i, in addition to the voltage sensor 70v. In one embodiment, the measurement circuit 70 has a voltage divider circuit. In one example, the voltage divider circuit is a resistor voltage divider circuit. The voltage sensor 70v is connected to a node between two resistors in the resistor voltage divider circuit. The voltage sensor 70v is configured to acquire a measurement value of a voltage at the node, i.e., a measurement value indicating a DC potential of the focus ring FR (hereinafter, referred to as a "measured potential value"). The measured potential value obtained by the voltage sensor 70v is transmitted to a controller MC to be described later.

The measurement circuit 70 may further include the current sensor 70i. The current sensor 70i is configured to acquire a measurement value (hereinafter, referred to as "measured current value") of a current flowing through an electrical path that connects the focus ring FR and the measurement circuit 70. The measured current value obtained by the current sensor 70i is transmitted to the controller MC.

In one embodiment, the plasma processing apparatus 1 further includes a DC power supply 72. The DC power supply 72 is configured to apply a negative DC voltage to the focus ring FR. By applying the negative DC voltage from the DC power supply 72 to the focus ring FR, a thickness of a sheath (plasma sheath) above the focus ring FR is adjusted. As a result, an incident direction of ions on the edge of the substrate W is adjusted.

The measurement circuit 70 and the DC power supply 72 are configured to be selectively connected to the focus ring FR. Therefore, the plasma processing apparatus 1 includes one or more switching elements. In one embodiment, the plasma processing apparatus 1 includes switching elements 70s and 72s for selectively connecting one of the measurement circuit 70 and the DC power supply 72 to the focus ring FR. Each of the switching elements 70s and 72s may be, e.g., a field effect transistor. When the switching element 70s is in a conducting state, one end of the voltage divider circuit of the measurement circuit 70 that is opposite to the ground is connected to the focus ring FR. When the switching element 72s is in a conducting state, the DC power supply 72 is connected to the focus ring FR. The controller MC controls the switching elements 70s and 72s such that one of the switching elements 70s and 72s is in a non-conducting state when the other one is in a conducting state.

The plasma processing apparatus 1 may further include a radio-frequency cutoff filter 74. The radio-frequency cutoff filter 74 is provided to prevent a radio-frequency power from flowing into the measurement circuit 70 and the DC power supply 72. The radio-frequency cutoff filter 74 has, e.g., a capacitor. One end of the capacitor of the radio-frequency cutoff filter 74 is connected to an electrical path between the focus ring FR and the voltage divider circuit of the measurement circuit 70 and between the focus ring FR and the DC power supply 72. The other end of the capacitor of the radio-frequency cutoff filter 74 is connected to the ground.

The plasma processing apparatus 1 further includes the controller MC. The controller MC is a computer including a processor, a storage device, an input device, a display device, and the like, and controls the respective components of the plasma processing apparatus 1. Specifically, the controller MC executes a control program stored in the storage device and controls the respective components of the plasma processing apparatus 1 based on recipe data stored in the storage device. The plasma processing apparatus 1 performs the processing specified by the recipe data under the control of the controller MC. Further, the plasma processing apparatus 1 performs methods according to various embodiments under the control of the controller MC.

Figure 3:
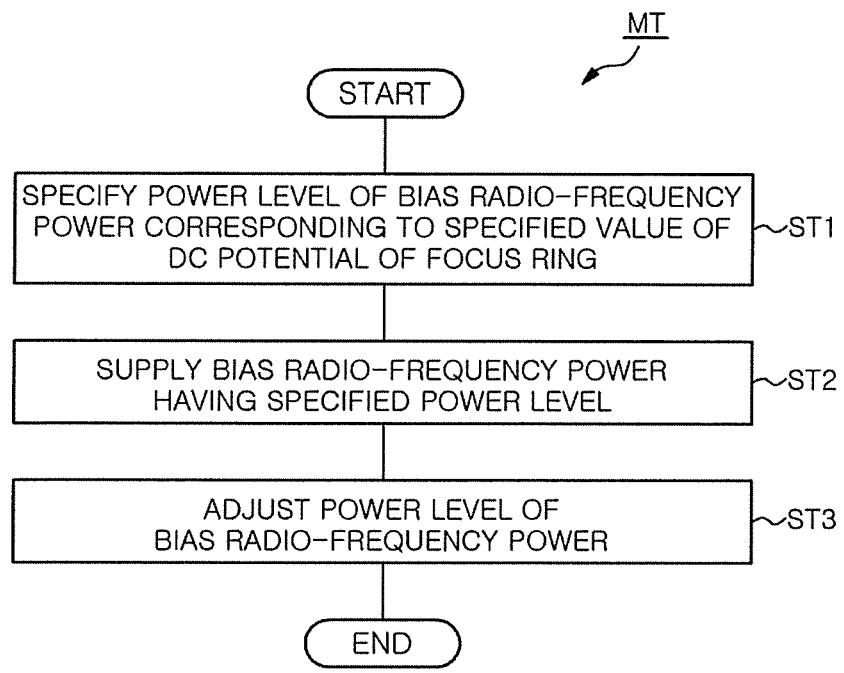
FIG. 3 is a flowchart showing a method for controlling a radio-frequency power supply of the plasma processing apparatus according to one exemplary embodiment.

Hereinafter, a method for controlling the radio-frequency power supply of the plasma processing apparatus according to one exemplary embodiment will be described with reference to FIG. 3. Further, the control of the respective components of the plasma processing apparatus 1 by the controller MC will be described. FIG. 3 is a flowchart showing the method for controlling the radio-frequency power supply of the plasma processing apparatus according to one exemplary embodiment.

First, in a method MT shown in FIG. 3, step ST1 is started. In step ST1, the controller MC specifies a power level of the radio-frequency power LF corresponding to a specified value of the DC potential of the focus ring FR by using a table or a function. The specified value of the DC potential of the focus ring FR may be inputted to the controller MC by an operator. Alternatively, the specified value of the DC potential of the focus ring FR may be stored as a part of the recipe data in the storage device of the controller MC. The table or the function used by the controller MC defines the relationship between the power level of the radio-frequency power LF and the DC potential of the focus ring FR generated by supplying the radio-frequency power LF to the lower electrode 18. The table or the function is given to the controller MC in advance. A method for creating the table or the function that defines the relationship between the DC potential of the focus ring FR and the power level of the radio-frequency power LF will be described later.

In the method MT, during the execution of steps ST2 and ST3, the measurement circuit 70 is connected to the focus ring FR and the DC power supply 72 is electrically disconnected from the focus ring FR. In step ST2, plasma is generated. In step ST2, the controller MC controls the gas supply unit to supply a gas into the chamber 10. In step ST2, the controller MC controls the gas exhaust unit 50 to set pressure in the chamber 10 to a specified pressure. In step ST2, the controller MC controls the radio-frequency power supply 62 to supply the radio-frequency power LF having the power level specified in step ST1 to the lower electrode 18. In step ST2, the controller MC may control the radio-frequency power supply to supply the radio-frequency power HF to the lower electrode 18 (or the upper electrode 30).

Subsequent step ST3 is executed during the plasma generation. In step ST3, the plasma generation is continued from step ST2. In step ST3, the measurement circuit 70 acquires a potential measurement value indicating the DC potential of the focus ring FR. In step ST3, the controller MC controls the radio-frequency power supply 62 to adjust the power level of the radio-frequency power LF in order to reduce the difference between the specified value and the DC potential of the focus ring that is determined by the potential measurement value.

Figure 4:
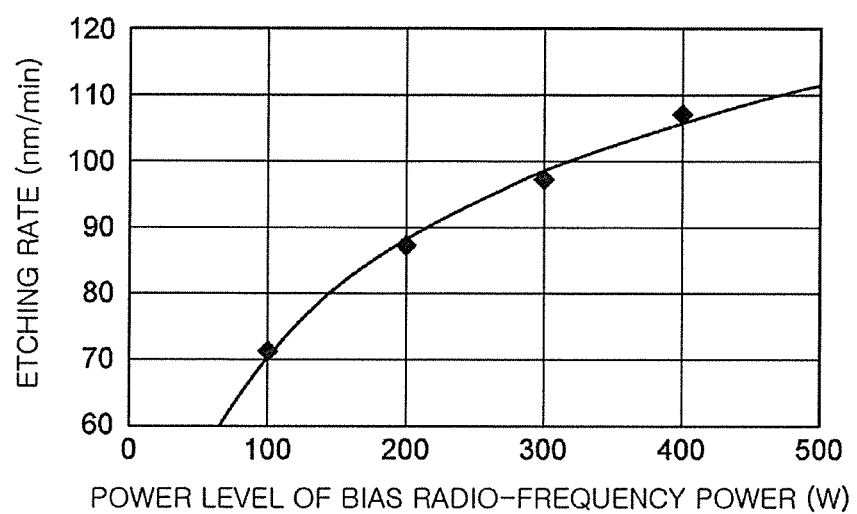
FIG. 4 is a graph showing an example of a relationship between a power level of a bias radio-frequency power and an etching rate.
Figure 5:
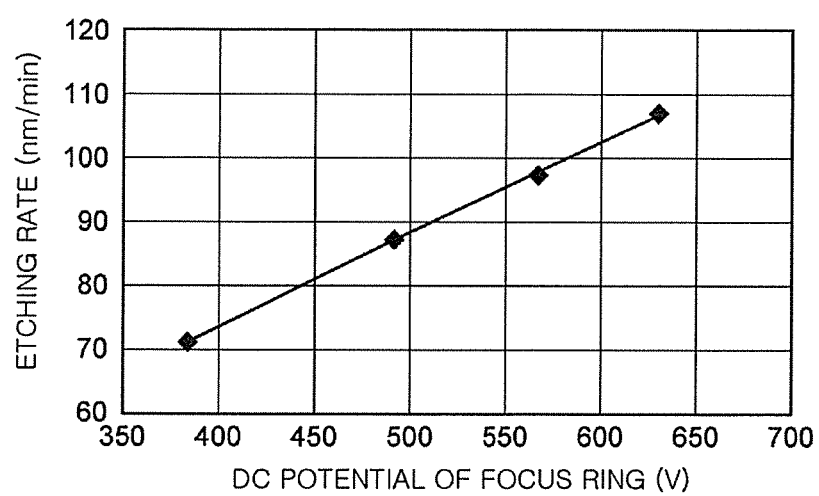
FIG. 5 is a graph showing an example of a relationship between a DC potential of a focus ring and an etching rate.
Figure 6:
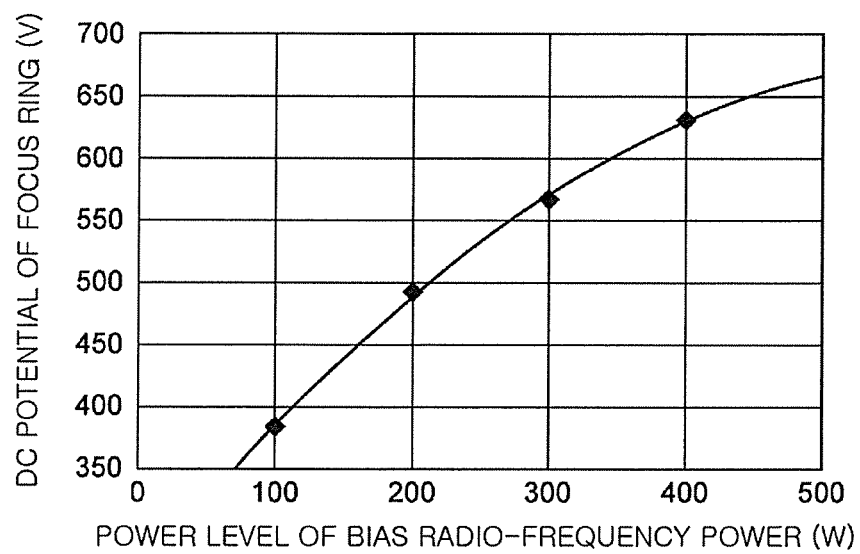
FIG. 6 is a graph showing an example of a relationship between a power level of a bias radio-frequency power and a DC potential of a focus ring generated by supplying the bias radio-frequency power to a lower electrode.

Next, the descriptions will be given with reference to FIGS. 4 to 6. FIG. 4 is a graph showing an example of the relationship between the power level of the bias radio-frequency power and the etching rate. In FIG. 4, the horizontal axis represents the power level of the bias radio-frequency power (the radio-frequency power LF) and the vertical axis represents the etching rate. FIG. 5 is a graph showing an example of the relationship between the DC potential of the focus ring and the etching rate. In FIG. 5, the horizontal axis represents the DC potential of the focus ring FR and the vertical axis represents the etching rate. FIG. 6 is a graph showing an example of the relationship between the power level of the bias radio-frequency power and the DC potential of the focus ring generated by supplying the bias radio-frequency power to the lower electrode.

In order to obtain the graphs shown in FIGS. 4 and 5, plasma etching was performed on a silicon oxide by the plasma processing apparatus 1 while setting various values for the power level of the radio-frequency power LF. The frequency of the radio-frequency power LF was 13 MHz. In the plasma etching, a fluorocarbon gas was supplied into the chamber 10 and the pressure in the chamber 10 was set to 20 mTorr (2.7 Pa). Further, in the plasma etching, the frequency and the power level of the radio-frequency power HF were set to 40 MHz and 500 W, respectively. Then, the relationship between the power level of the radio-frequency power LF and the etching rate of the silicon oxide film was obtained. FIG. 4 shows the relationship between the power level of the radio-frequency power LF and the etching rate of the silicon oxide film. In addition, the DC potential of the focus ring FR was obtained by the voltage sensor (70v) of the measurement circuit 70 during the plasma etching. Then, the relationship between the DC potential of the focus ring FR and the etching rate of the silicon oxide film was obtained. Further, the relationship between the power level of the radio-frequency power LF and the DC potential of the focus ring FR was obtained. FIG. 5 shows the relationship between the DC potential of the focus ring FR and the etching rate of the silicon oxide film. FIG. 6 shows the relationship between the power level of the radio-frequency power LF and the DC potential of the focus ring FR.

As shown in FIG. 4, the etching rate is increased as the power level of the bias radio-frequency power, i.e., the power level of the radio-frequency power LF, is increased. As shown in FIG. 4, the power level of the radio-frequency power LF has a non-linear relationship with the etching rate. On the other hand, the DC potential of the focus ring FR generated by supplying the radio-frequency power LF during the plasma generation is substantially the same as the DC potential of the substrate W and is substantially linearly proportional to the etching rate as shown in FIG. 5. In the plasma processing apparatus 1, as shown in FIG. 6, the power level of the radio-frequency power LF, which is set during the plasma generation, is determined using a table or a function indicating the relationship between the DC potential of the focus ring FR and the power level of the radio-frequency power LF. In other words, in the plasma processing apparatus 1, the power level of the radio-frequency power LF, which is set during the plasma generation, is determined based on the DC potential of the focus ring FR that is substantially linearly proportional to the etching rate. Therefore, the plasma processing apparatus 1 can improve the controllability of the etching rate.

Meanwhile, even when the radio-frequency power LF having the same power level is applied to the lower electrode 18, the DC potential of the focus ring FR may be changed due to the changes of the state of the plasma processing apparatus 1, for example. In one embodiment, the power level of the radio-frequency power LF is adjusted during the plasma generation to reduce the difference between the specified value of the DC potential of the focus ring FR and the actual DC potential of the focus ring FR obtained from the potential measurement value of the measurement circuit 70. Therefore, a desired etching rate is realized with a high accuracy.

In one embodiment, the DC power supply 72 can be selectively connected to the focus ring FR. Thus, a DC voltage can be applied to the focus ring FR. When the potential measurement value of the DC potential of the focus ring FR is measured, the DC power supply 72 can be electrically disconnected from the focus ring FR.

Figure 7:
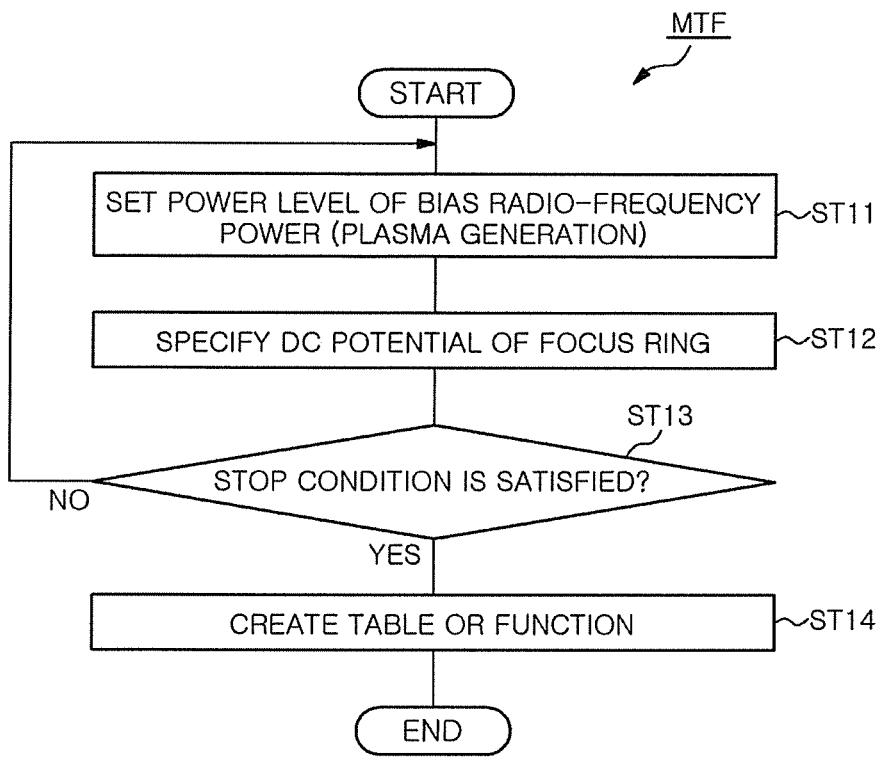
FIG. 7 is a flowchart showing a method for creating a table or a function that defines a relationship between a DC potential of a focus ring and a power level of a bias radio-frequency power according to one exemplary embodiment.

Hereinafter, a method for creating the table or the function that defines the relationship between the DC potential of the focus ring FR and the power level of the radio-frequency power LF will be described. FIG. 7 is a flowchart showing the method for creating the table or a function that defines the relationship between the DC potential of the focus ring and the power level of the bias radio-frequency power according to one exemplary embodiment.

First, step ST11 of the creation method (hereinafter, referred to as "method MTF") shown in FIG. 7 is started. In step ST11, plasma is generated in the chamber 10. In step ST11, conditions such as the gas supplied into the chamber 10, the pressure in the chamber 10, and the power level of the radio-frequency power HF are the same as those in steps ST2 and ST3 of the method MT. In step ST11, the power level of the radio-frequency power LF is sequentially selected from multiple power levels.

Next, in the subsequent step ST12, the DC potential of the focus ring FR is specified from the potential measurement value measured by the measurement circuit 70. In step ST12, one data set including the specified DC potential of the focus ring FR and the power level of the radio-frequency power LF set in step ST11 is obtained.

Next, in ST13, it is determined whether or not a stop condition is satisfied. The stop condition is satisfied when step ST11 has been performed for all the power levels. If it is determined in step ST13 that the stop condition is not satisfied, steps ST11 and ST12 are repeated. In step ST11, one unselected power level among the multiple power levels is selected for the power level of the radio-frequency power LF. On the other hand, if it is determined in step ST13 that the stop condition is satisfied, the processing proceeds to step ST14.

In step ST14, a table or a function indicating the relationship between the DC potential of the focus ring FR and the power level of the radio-frequency power LF is created using a plurality of data sets obtained by repeating the sequence of steps ST11 and ST12. The controller MC uses the table or the function created by the method MTF to determine the power level of the radio-frequency power LF from the specified value as described above.

While various embodiments have been described above, various omissions, substitutions, and changes may be made without being limited to the above-described embodiments. Further, other embodiments can be implemented by combining elements in different embodiments.

For example, in another embodiment, the plasma processing apparatus may be any type of a plasma processing apparatus different from the capacitively coupled plasma processing apparatus. For example, an inductively coupled plasma processing apparatus, a plasma processing apparatus for generating plasma using surface waves such as microwaves, or the like, may be used as the plasma processing apparatus.

From the foregoing, it will be appreciated that various embodiments of the present disclosure have been described herein for purposes of illustration and various changes can be made without departing from the scope and spirit of the present disclosure. Accordingly, various embodiments described herein are not intended to be limiting, and the true scope and spirit are indicated by the following claims.

DESCRIPTION OF REFERENCE NUMERALS

1: plasma processing apparatus
10: chamber
16: support
18: lower electrode
62: radio-frequency power supply
MC: controller

The invention claimed is:

1. An apparatus for plasma processing comprising:
a chamber;
a substrate support disposed in the chamber and including a lower electrode, the substrate support mounting a focus ring to surround a disposed substrate on the substrate support;
a radio-frequency power supply configured to supply a bias radio-frequency power to the lower electrode; and
a controller configured to cause
specifying a power level of the bias radio-frequency power corresponding to a specified value of a DC potential of the focus ring by using a table or a function that defines a relationship between the power level of the bias radio-frequency power and the DC potential of the focus ring generated by supplying the bias radio-frequency power to the lower electrode, and
controlling the radio-frequency power supply to supply the bias radio-frequency power having the specified power level to the lower electrode during a plasma generation in the chamber.

2. The apparatus of claim 1, wherein the apparatus is a capacitively coupled plasma processing apparatus.

3. The apparatus of claim 1, further comprising:
a DC power supply configured to be selectively connected to the focus ring.

4. The apparatus of claim 3, wherein the apparatus is a capacitively coupled plasma processing apparatus.

5. The apparatus of claim 1, further comprising:
a measurement circuit configured to obtain a measurement value indicating the DC potential of the focus ring,
wherein the controller adjusts the power level of the bias radio-frequency power during the plasma generation in the chamber to reduce a difference between the specified value and the DC potential of the focus ring that is determined by the measurement value.

6. The apparatus of claim 5, further comprising:
a DC power supply configured to be selectively connected to the focus ring.

7. The apparatus of claim 5, wherein the apparatus is a capacitively coupled plasma processing apparatus.

8. A method for controlling a radio-frequency power supply of an apparatus for plasma processing, comprising:
specifying a power level of a bias radio-frequency power corresponding to a specified value of a DC potential of a focus ring by using a table or a function that defines a relationship between the power level of the bias radio-frequency power and the DC potential of the focus ring generated by supplying the bias radio-frequency power to a lower electrode of a substrate support, wherein the substrate support is disposed in a chamber of the apparatus and the focus ring is mounted on the substrate support to surround the substrate; and
controlling the radio-frequency power supply to supply the bias radio-frequency power having the specified power level to the lower electrode during a plasma generation in the chamber.

9. The method of claim 8, further comprising:
adjusting the power level of the bias radio-frequency power supply during the plasma generation in the chamber to reduce a difference between the specified value and the DC potential of the focus ring that is determined by the measurement value.

* * * * *